(12) United States Patent
Selvan et al.

(10) Patent No.: US 7,430,918 B2
(45) Date of Patent: Oct. 7, 2008

(54) AMPLIFIED FLOW THROUGH PRESSURE SENSOR

(75) Inventors: Thirumani A. Selvan, Bangalore (IN); Saravanan Sadasivan, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 64 days.

(21) Appl. No.: 11/633,692

(22) Filed: Dec. 4, 2006

(65) Prior Publication Data

US 2008/0127741 A1    Jun. 5, 2008

(51) Int. Cl.
*G01L 9/06* (2006.01)
(52) U.S. Cl. ......................................... 73/721; 73/727
(58) Field of Classification Search ............... 73/721, 73/727
See application file for complete search history.

(56) References Cited

U.S. PATENT DOCUMENTS

| | | | |
|---|---|---|---|
| 5,184,107 A * | 2/1993 | Maurer | |
| D361,534 S | 8/1995 | Cook | D10/96 |
| 5,644,285 A * | 7/1997 | Maurer | |
| 5,756,899 A * | 5/1998 | Ugai et al. | |
| 6,153,070 A | 11/2000 | Maurer et al. | 204/416 |
| 6,971,886 B2 | 12/2005 | Chien | 702/45 |
| 2002/0149070 A1 * | 10/2002 | Sheplak et al. | 257/415 |
| 2005/0021247 A1 * | 1/2005 | Liu et al. | |
| 2006/0000265 A1 * | 1/2006 | Parker et al. | |

FOREIGN PATENT DOCUMENTS

| | | | |
|---|---|---|---|
| DE | 10114648 A1 * | 10/2002 | |
| EP | 0180662 A1 * | 5/1986 | |
| EP | 0480544 A2 * | 4/1992 | |

* cited by examiner

*Primary Examiner*—Andre J Allen
(74) *Attorney, Agent, or Firm*—Kermit D. Lopez; Luis M. Ortiz

(57) ABSTRACT

A MEMS based pressure sensor for flow measurements includes a pressure sense die located between a media seal and a conductive seal. Such a system includes a pressure sense die located between a media seal and a conductive seal. A sensing diaphragm is generally associated with the pressure sense die, wherein the sensing diaphragm deflects when a pressure is applied thereto. An impedance circuit is generally embedded with one or more resistors on the sensing diaphragm to which the pressure to be detected is applied. An ASIC is generally associated with the impedance circuit and the sense die, wherein the ASIC is placed on a lead frame for signal conditioning in order to detect a change in the pressure.

20 Claims, 7 Drawing Sheets

SECTION A-A

SECTION B-B

SECTION C-C

AMPLIFIED FLOW THROUGH PRESSURE SENSOR

TECHNICAL FIELD

Embodiments are generally related to sensor methods and systems. Embodiments are also related to MEMS (Microelectromechanical System) based pressure sensors. Embodiments are additionally related to pressure sensors that incorporate ASIC (Application Specific Integrated Circuit) components for signal conditioning and/or amplification.

BACKGROUND OF THE INVENTION

Many processes and devices have been used for measuring flow rate in different applications. A miniature MEMS based pressure sensor can be used to measure very low flow rates and with a reliable accuracy. Such MEMS based pressure sensors have been implemented, for example, in various flow sensing devices, such as medical applications, some of which utilize silicon piezoresistive sensing technology for measuring very low pressures. Other flow sensing implementations, for example, include environmental applications.

MEMS involve the integration of micro-mechanical elements, sensor actuators, and electronic components on a common silicon substrate through the use of microfabrication technology. While the electronics can be fabricated using integrated circuit (IC) process sequences (e.g., CMOS, Bipolar, or BICMOS processes), the micromechanical components can be fabricated using compatible "micromachining" processes that selectively etch away parts of the silicon wafer or add new structural layers to form the mechanical and electromechanical devices. MEMS promises to revolutionize nearly every product category by bringing together silicon based microelectronics with micromachining technology, making possible the realization of complete "system-on-a-chip". MEMS is an enabling technology allowing the development of "smart" products, while augmenting the computational ability of microelectronics with the perception and control capabilities of microsensors and microactuators, while expanding the space of possible designs and applications.

The majority of prior art MEMS pressure transducers produced for the automotive market, for example, typically include a four-resistor Wheatstone bridge fabricated on a single monolithic die using bulk-etch micromachining technology. The piezoresistive elements integrated into the sensor die can be located along the periphery of the pressure sensing diaphragm at points appropriate for strain measurement. Such sensors are inexpensive to produce and can be processed in association with integrated circuits on a wafer that may contain a few hundred to a few thousand sensing elements.

In a bridge configuration, the resistance of diagonally opposed legs varies equally and in the same direction, as a function of the mechanical deformation caused by pressure. As the resistance of one set of diagonally opposed legs increases under pressure, the resistance of the other set decreases, and vice versa. Bridge excitation in the form of voltage or current is applied across two opposite corners of the bridge. Any change in voltage (e.g., pressure) can be detected as a voltage difference across the other two corners of the bridge, typically referred to as signal output. Unfortunately for silicon piezoresistive sensors, this voltage difference is quite small. Thus, the sensor must be compensated before it can be used.

Bulk-micromachined silicon pressure sensors typically incorporate the use of a diaphragm that deflects when subjected to a pressure load, and also include a piezoresistive transducer that translates strain to a differential voltage. Metal pads can be used to interface with other system components. Signal-conditioning circuitry for calibration or amplification is optional, but is often included as well. The piezoresistive transducer is strategically placed near the edge of the diaphragm, since that is a high-strain location and each sensor is designed, such that its output voltage is linearly proportional to the applied pressure in its operating range.

In some applications, it is preferred that a signal conditioning/signal amplification capability be incorporated into the sensors. It is believed that there is currently no amplified flow through sensors based on piezoresistive sensing technology in an integrated package. It is further believed that if such a sensor could be implemented, this would help in lowering installation and development costs, while eliminating secondary operations and shortening the design cycle time.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor for measuring very low flow rates with a reliable accuracy.

It is another aspect of the present invention to provide for a pressure sensor that integrates an ASIC for signal conditioning and isolates the ASIC from a pressure sensing die cavity.

It is a further aspect of the present invention to provide for a miniature amplified and temperature compensated flow through sensor in a single package.

The aforementioned aspects and other objectives and advantages can now be achieved as described herein. A pressure sensor is system and/or pressure sensing device are disclosed. Such a device includes a housing partitioned into two halves. In one half, a pressure sensing die with a conductive seal and a media seal can be packaged and in the other half, an ASIC can be provided. The ASIC is preferably placed on the lead frame so that the temperature sensor in the ASIC is used for temperature compensation. The whole housing can then be packaged with a top case, which can be heat-sealed, ultrasonic welded or any other plastic joining process.

The pressure sensor can be implemented in the context of a MEMS based pressure sensing system for flow rate measurements. Such a system includes a pressure sense die located between a media seal and a conductive seal. A sensing diaphragm is generally associated with the pressure sense die, wherein the sensing diaphragm deflects when a pressure is applied thereto. An impedance circuit is generally embedded with one or more resistors on the sensing diaphragm to which the pressure to be detected is applied. An ASIC is generally associated with the impedance circuit and the sense die, wherein the ASIC is placed on a lead frame for signal conditioning in order to detect a change in the pressure.

BRIEF DESCRIPTION OF THE DRAWINGS

The accompanying figures, in which like reference numerals refer to identical or functionally similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
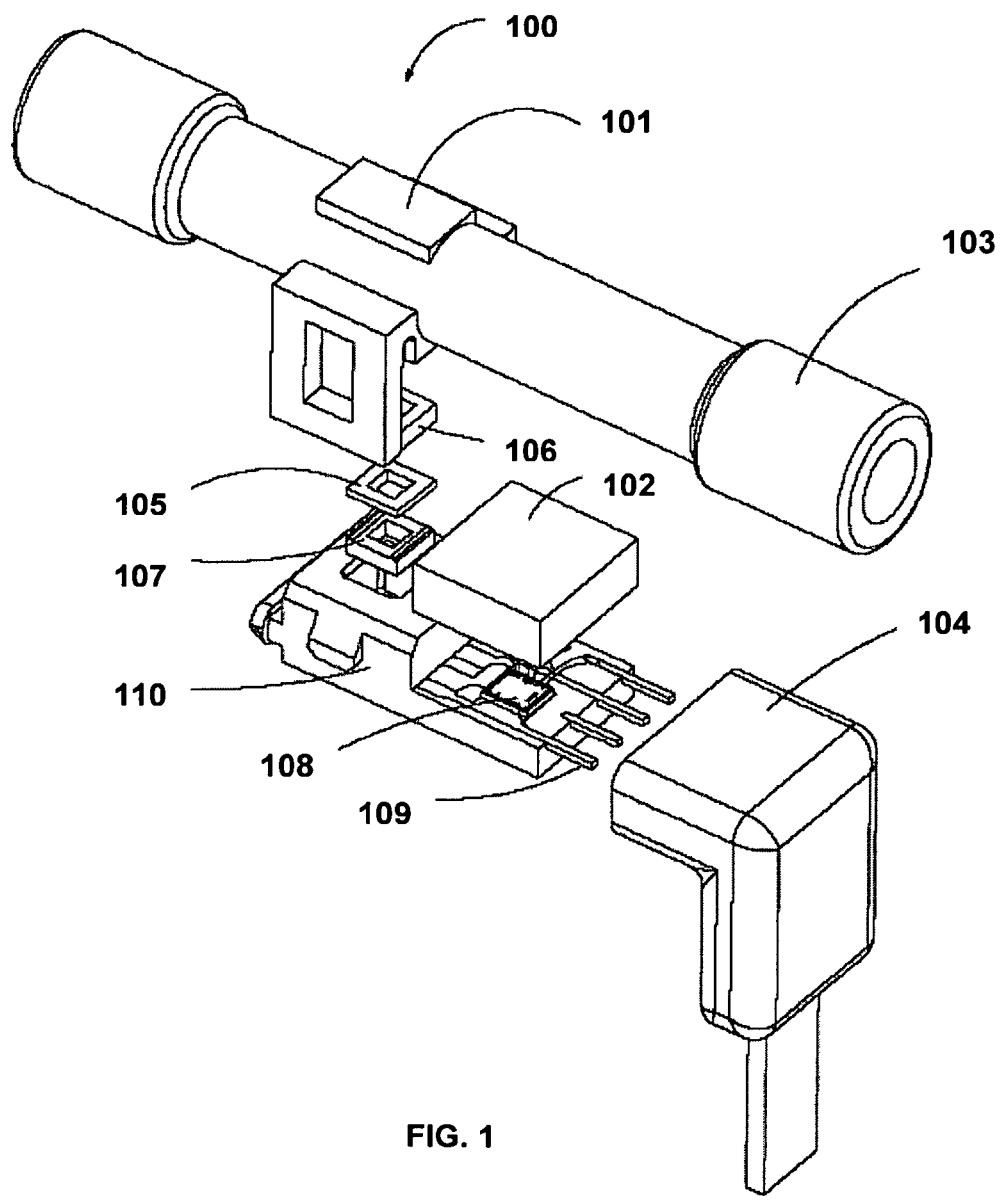
FIG. 1 illustrates exploded-perspective view of an amplified flow through pressure sensor incorporating an ASIC, which can be implemented in accordance with a preferred embodiment.

FIG. 1 illustrates an exploded-perspective view of an amplified flow through pressure sensor 100, which can be implemented in accordance with a preferred embodiment. The amplified flow through sensor 100 can be partitioned into two halves, first half 101 and second half 102. A tube 103 is generally located between and proximate to the first half 101 and second half 102. In first half 101, a pressure sense die 105 can be packaged with a media seal 106 and a conductive seal 107. A pressure inducing substance can flow through tube 103. In the second half 102, an ASIC 108 can be located and packaged. The sensor 100 can be placed in a desired base with the assistance of a connector 104.

FIG. 1 further illustrates a second half 102 of the pressure sensor 100 wherein the ASIC 108 is placed. The ASIC 108 is generally placed on a lead frame 109 so that a temperature sensor in the ASIC 108 is used for temperature compensation. The ASIC 108 placed on the lead frame 109 can be located on a plastic housing 110 on the second half 102 of the sensor 100. The entire sensor 100 can be heat-sealed, ultrasonic welded or joined by any other plastic joining process. The ASIC 108 incorporated in the second half 102 of the sensor brings about a signal amplification.

Figure 2:
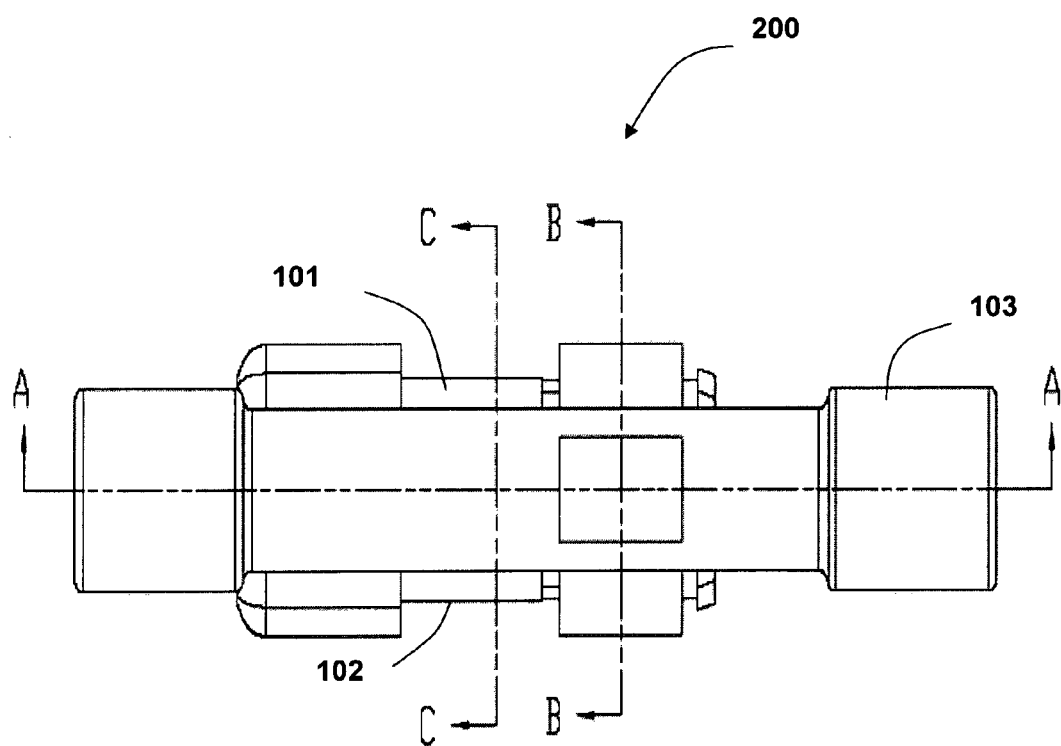
FIG. 2 illustrates a plan view of a flow through pressure sensor package, which can be implemented in accordance with a preferred embodiment.

FIG. 2 illustrates a plan view 200 of the flow through pressure sensor 100 according to a preferred embodiment. Note that in FIGS. 1-2, identical or similar parts or elements are generally indicated by identical reference numerals. For example, the first half 101 and second half 102 of the sensor and the flow through tube 103 depicted in FIG. 1 also appears in FIG. 2. The plane A-A illustrates the horizontal cross-section of flow through pressure sensor and the lines B-B and C-C illustrates the vertical cross-section of the flow through pressure sensor 100. The first half of the amplified flow through sensor 100 is illustrated by 101 and second half is illustrated by 102. The sensor 100 can be placed in a desired base with the assistance of a connector 104, depending upon design considerations.

Figure 3:
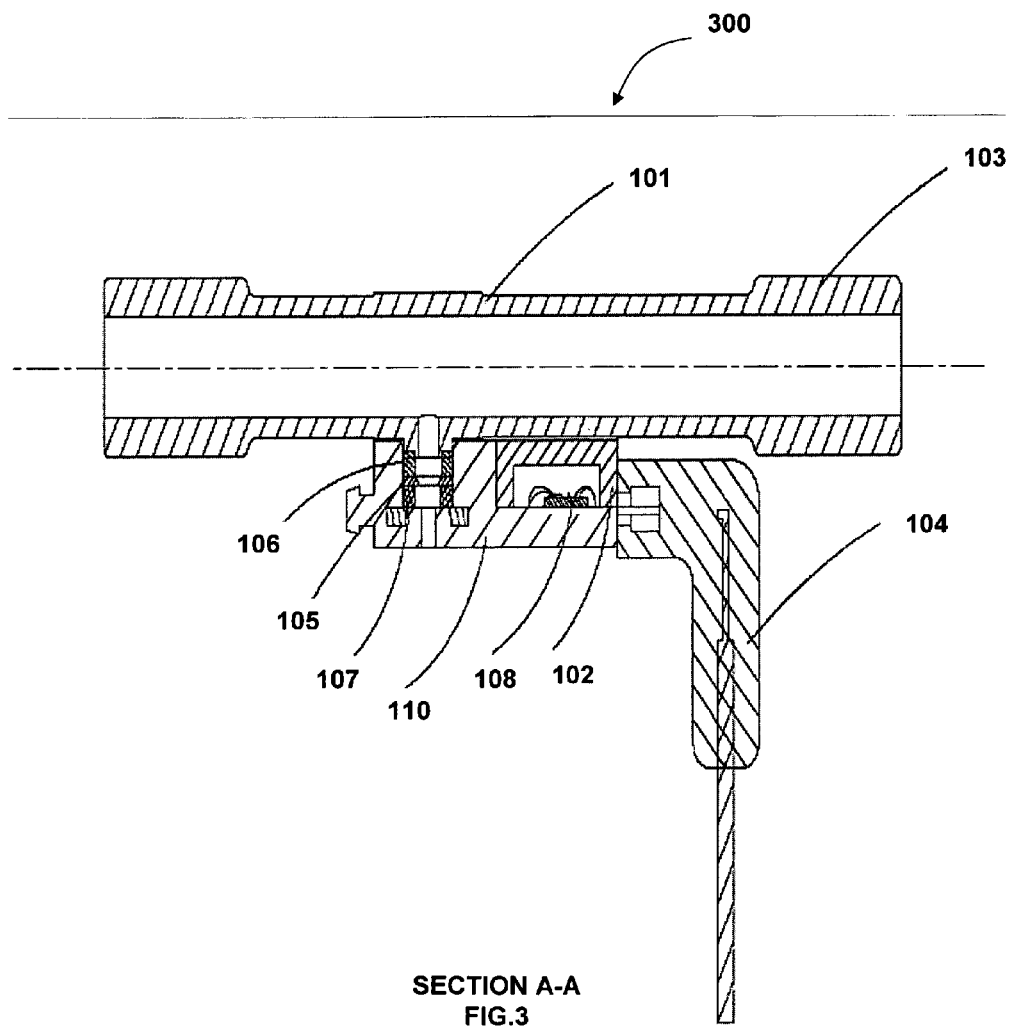
FIG. 3-5 illustrates cross-sectional views taken along lines A-A, B-B and C-C respectively, with respect to the illustration depicted in FIG. 2, in accordance with a preferred embodiment.

FIG. 3 illustrates a cross-sectional view 300 along the plane A-A that includes the first half 101 and second half 102 of the amplified flow through pressure sensor 100. Note that in FIGS. 1-3, identical or similar parts or elements are generally indicated by identical reference numerals. Thus the reference numerals 101, 102, 103, 104, 105, 106, 107, 110 as depicted in FIG. 1 refer to the same components in FIG. 3. A pressure sense die 105 can be packaged with a media seal 106 and a conductive seal 107. A pressure inducing substance can flow through tube 103. The second half 102 has a plastic housing 110 where the ASIC 108 is placed. The sensor 100 can be placed in a desired base with the assistance of a connector 104.

Figure 4:
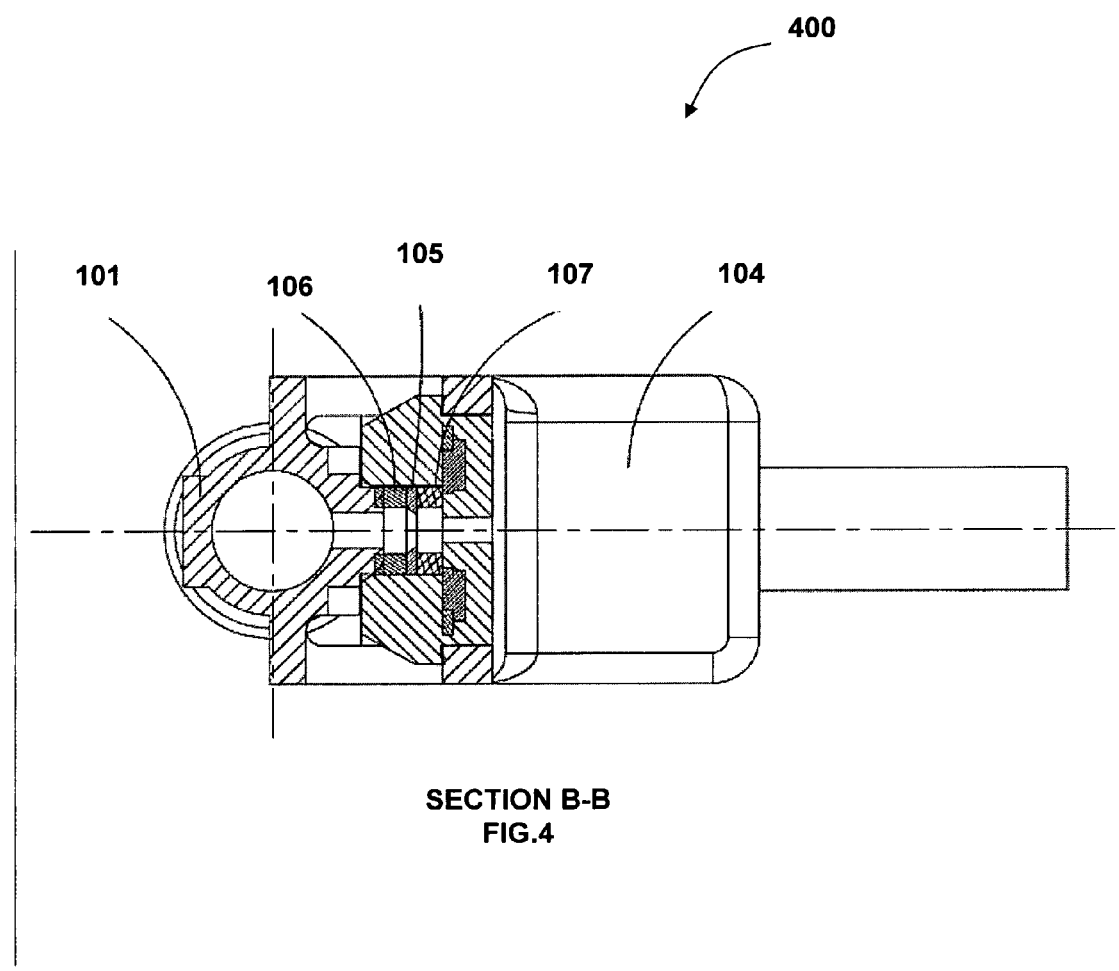

FIG. 4 illustrates a cross sectional view 400 of the amplified flow through pressure sensor along the plane B-B. Note that in FIGS. 1-3, identical or similar parts or elements are generally indicated by identical reference numerals. Thus, the reference numerals 101, 104, 105, 106, and 107 as depicted in FIG. 1 refer to the same components in FIG. 4. The figure illustrates the first half 101 of the pressure sensor. A pressure sense die 105 can be packaged with a media seal 106 and a conductive seal 107 as illustrated in the figure. The sensor 100 can be placed in a desired base with the assistance of a connector 104.

Figure 5:
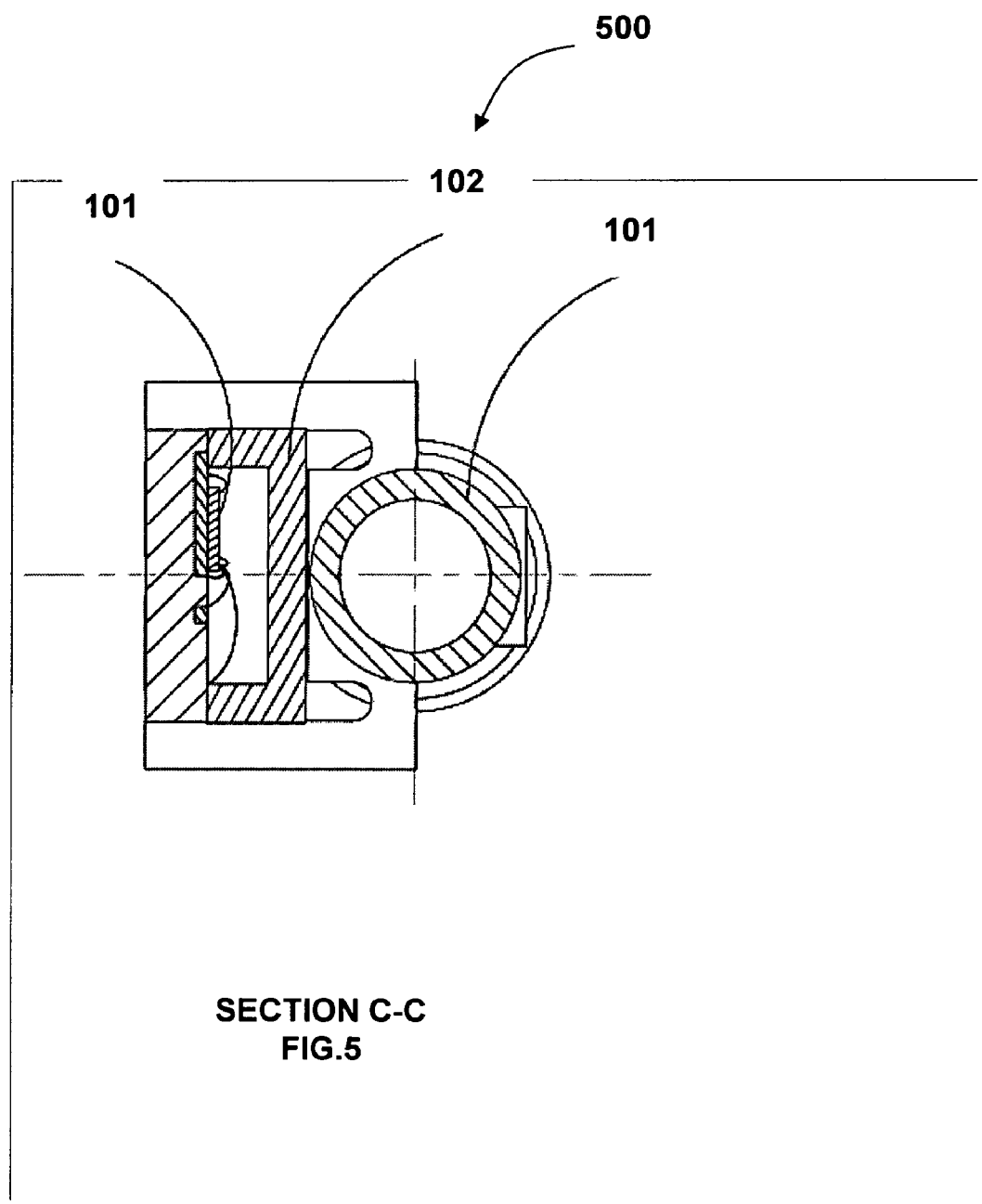

FIG. 5 illustrates a cross-sectional view 500 of the flow through sensor along the section C-C that includes the first half 101 and second half 102 of the amplified flow through pressure sensor 100. Note that in FIGS. 1-5 identical or similar parts or elements are generally indicated by identical reference numerals. Thus, the reference numerals 101 and 102 as depicted in FIG. 1 refer to the same components in FIG. 4.

Figure 6:
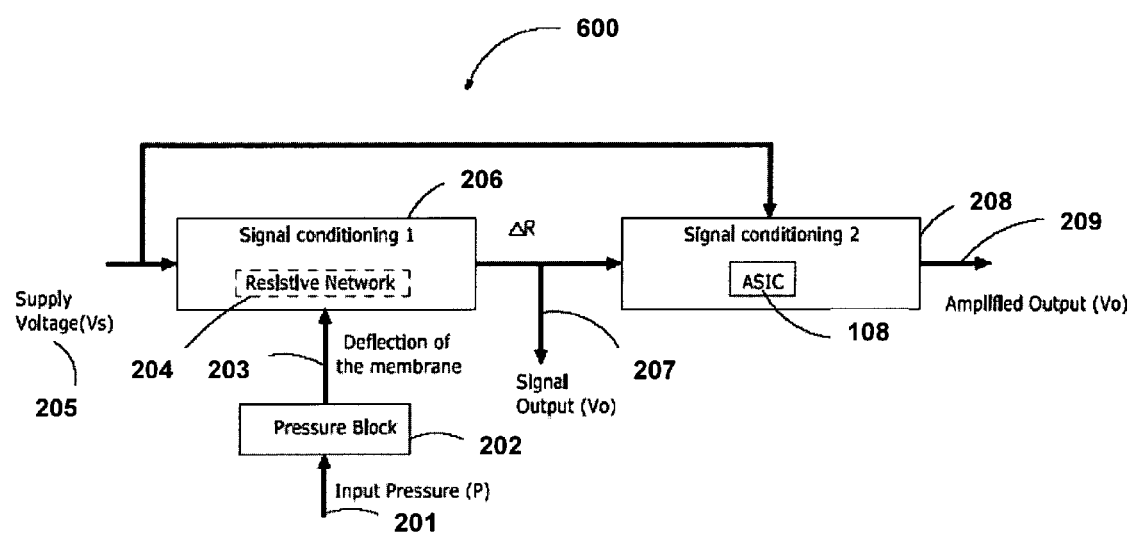
FIG. 6 illustrates a detailed functional block diagram of a pressure sensor incorporating an ASIC as depicted in FIG. 1, where pressure is applied to the bottom side, in accordance with a preferred embodiment.

FIG. 6 illustrates a functional block diagram 600 of a pressure sensor 100 with an ASIC 108 as depicted in FIG. 1 incorporated for signal conditioning and amplification when pressure is applied on the pressure die 105, in accordance with a preferred embodiment. Note that in FIGS. 1 and 6, identical or similar parts and/or elements are generally indicated by identical reference numerals. Thus reference numerals 100 and 108 depicted in FIG. 1 refers to the same components in FIG. 6. Pressure sensor 100 generally includes a pressure block 202 in association with a first signal conditioning unit 206, which is connected to a second signal conditioning unit 208. The first signal conditioning unit 206 generates one or more signals that can be transmitted to the second signal conditioning unit 208. An external supply voltage 205 provides a voltage to the first signal conditioning unit 206 and the second signal conditioning unit 208. The pressure sensor 100 additionally includes an ASIC 108 in the signal conditioning unit 208.

As depicted by arrow 201 in FIG. 6, input pressure (P) can be applied to the pressure block 202. This pressure change causes a deflection of a membrane as indicated by arrow 203, and as a result deflection to resistance change of the resistive network 204 occurs in the signal conditioning unit 206. This process can be referred to as "signal conditioning". The external supply voltage (Vs) 205 can be provided to the signal conditioning units 206 and 208, which in turn produces the output signal ($V_o$) 207, which occurs via the first signal conditioning unit 206. The output signal 207 is then passed to the second signal conditioning unit 208. ASIC 108 generally performs signal conditioning/amplification at the second signal conditioning unit 208 and generates an amplified output signal 209 (i.e., $V_o$ amplified). The sensor signal conditioning units 206 and 208 work together to perform all necessary functions for calibration, temperature compensation influence and linearizing the amplified output signal 209, and thus improvement is obtained by integrating the ASIC 108 for signal conditioning and its isolation from the pressure block 202.

Figure 7:
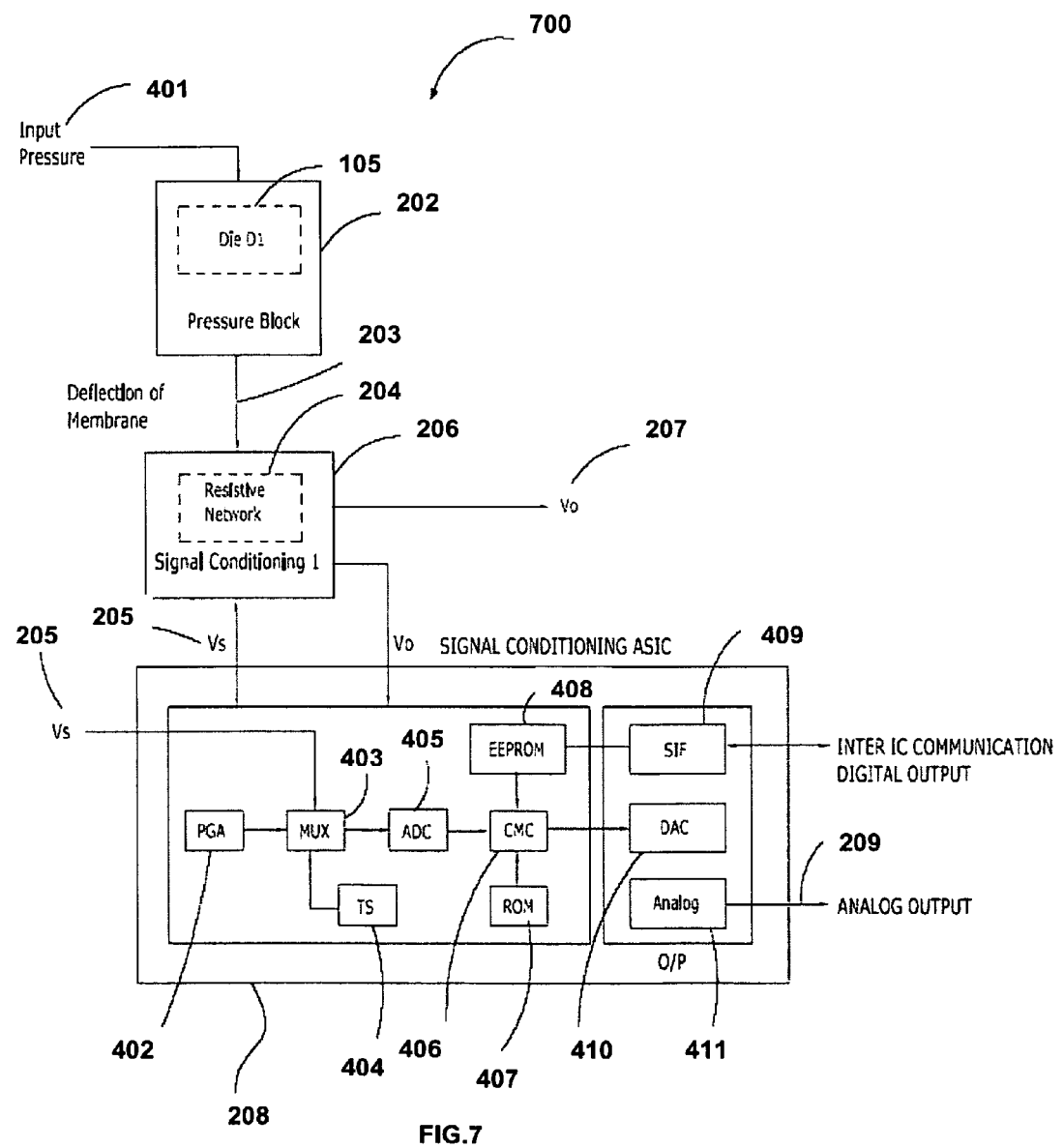
FIG. 7 illustrates a detailed functional block diagram of a pressure sensor incorporating an ASIC as depicted in FIG. 1, where pressure is applied to the top side, in accordance with an alternative embodiment.

FIG. 7 illustrates a high-level block diagram 400 of a pressure sensor 100 incorporating an ASIC 108 depicted in FIG. 1, in accordance with a preferred embodiment. Note that in FIGS. 1-7, identical or similar parts and/or elements are generally indicated by identical reference numerals. Thus reference numerals 105 and 108 as depicted in FIG. 1 and reference numerals 202, 203, 204, 205, 206, 207, 208 and 209 depicted in FIG. 6 refers to the same components in FIG. 7. As indicated by arrow 401 in FIG. 7, input pressure can be applied to the pressure block 202. Pressure sense die 105 senses the pressure change and causes a deflection of membrane as indicated by the arrow 203 and as a result change in resistance of the resistive network 204 occur in the first signal conditioning unit 206. The signal conditioning unit 206 generates an output signal (Vo) 207. The ASIC 108 performs signal conditioning and amplification at the second signal conditioning unit 208 and generates the amplified output signal ($V_o$ amplified) 209 and corrects the output digitally. In some implementations, the ASIC 108 can be powered by a 5 Volt DC source ($V_s$) 205.

Positioned within the second cavity is a signal amplifier 108 which is in electrical contact with the pressure sensor and amplifies a signal from the pressure sensor representative of the pressure of a fluid such as air or air and water vapor within the first cavity. The signal amplifier is preferably an application specific integrated circuit (ASIC), which is well known in the art. ASIC's can also be used for signal-conditioning a MEMS silicon piezoresistive sensor. The ASIC may be employed to calibrate and compensate the pressure sensor with a total error of less than ±1% full scale output (FSO) over its operating pressure range. The total error includes effects due to offset and sensitivity, as well as the offset and sensitivity temperature coefficients.

ASIC's are useful because a typical output signal for a piezoresistive pressure sensor depends on temperature. Useful ASIC's include, for example, ASIC devices such as the DSP-based circuit from Fujikura Ltd. in Tohoku, Japan that may correct for the sensor's offset and sensitivity. Such an example Fujikura's circuit can operate in a temperature range from −30° C. to 80° C. The example Fujikura's ASIC can be configured on a 0.7-pm double-polysilicon, double-metal, n-well CMOS process. It has a sigma-delta 16-bit analog-to-digital converter, a reference voltage with a built-in temperature sensor, the 16-bit DSP core, 101 polysilicon fuses, a step-up voltage regulator, a 10-bit digital-to-analog converter (DAC), and a 4-MHz oscillator. Corrected coefficients are stored using the polysilicon fuses. The output code is accessible with a serial interface or an analog signal provided by a 10-bit DAC. This circuit also may compensate for secondary temperature characteristics and can utilize, for example, a 120 serial interface. A built-in charge pump permits the device to function within circuits rated under 3 V. A "sleep" mode reduces power consumption.

Another example of an ASIC is a device produced by The Institute of Microelectronics in Singapore, which is a fully customized analog ASIC with a fusible-link array that achieves the aforementioned performance from −40° C. to 125° C. Such an ASIC can be configured via a 0.8-pm double-polysilicon, double-metal CMOS process. This type of an ASIC includes a core analog signal processor, a 64-bit fusible link array, and a serial fusible-link interface. The ASIC's digital portion provides the interface between the analog signal processor and controller. This controller writes data to an interface and reads data back from it by a serial-in and serial-out communications protocol. Data in the serial interface can be loaded into the fusible-link array to control various resistor networks in the analog signal processor. These resistor networks are used for various programmable functions.

All of these programmable elements make it possible to compensate for the calibration, sensitivity, and temperature effects to the first order. The ASIC features an output of 0.5 to 4.5 V using a 5-V power supply. Other suitable signal amplifiers, which may be adapted in accordance with alternative embodiments, include for example, a ZMD31050RB[IC] series advanced differential sensor signal conditioner, commercially available from ZMD America Inc, of Melville, N.Y.

The signal path of the ASIC 108 is partly analog and partly digital. The analog part is realized differentially. Consequently, it is possible to amplify positive and negative input signals, which are located in the common mode range of the signal input. The electrical output signal ($V_o$) 207 from the signal conditioning unit 206 can be pre-amplified by a programmable gain amplifier (PGA) 402. A multiplexer (MUX) 403 can be utilized to transmit signals generated by signal conditioning unit 206 or a separate temperature sensor (TS) 404 to an analog-to-digital converter (ADC) 405 in a certain sequence. Thereafter, the ADC 405 converts these signals to digital values. A digital signal correction takes place in a calibration microcontroller (CMC) 406 and is based on a special correction formula located in an ROM 407 and on sensor-specific coefficients stored into an EEPROM 408 during calibration.

The output signal ($V_o$ Amplified) 209 can be provided at a serial interface (SIF) 409. The final value can be converted to an analog voltage via an 11-bit Digital-to-Analog converter (DAC) 410. The analog output 411 possesses registers which can store the actual pressure and the results of temperature measurement. According to the programmed output configuration, the corrected sensor amplified signal output ($V_o$ amplified) 209 is produced as the analog value. The configuration data and the correction parameters can be programmed into the EEPROM 408 via the serial digital interfaces 409. The signal paths from pressure sense die 105 to the amplified output signal 209 ($V_o$ amplified) is generally analog-digital-analog for isolation and compensation flexibility.

The correction values at each temperature of calibration can be recorded utilizing a computer. A calculation can then be utilized to fabricate a multi-order equation that corrects the sensor's output over temperature. The coefficients for that equation can be loaded into the unit's EEPROM 408 after the final calibration temperature data is taken. After the correction equation coefficients are loaded into the unit's EEPROM 408, the device is considered fully calibrated. The calibration procedure should preferably include the set of coefficients of calibration calculation and depending on the configuration, the adjustment of the extended offset compensation, the zero compensation of temperature measurement, and the adjustment of the bridge current.

The pressure sensor described herein can be inexpensively manufactured and marketed and can include temperature compensation and calibration capabilities, along with media flow-through ports and true "wet" differential sensing and is also operable after exposure to frozen conditions with a choice of termination for gage sensors. Such a sensor can also provide interchangeability, proven elastomeric construction, ASIC based signal conditioning and digital output and can be used to measure vacuum or positive pressure.

The disclosed pressure sensor device and system can find usefulness in a wide range of application, such as, for example, medical applications, including but not limited to dental chairs, nebulizers, kidney dialysis machines, blood cell separators and so forth. Such products not only simplify the testing, monitoring, and treatment process, but will also assist in improving the quality of life for patients by minimizing time spent in hospitals and providing automatic and continuous treatment of chronic conditions. Such a device and/or system can also be employed in environmental applications, such as water control valves, instrumentation, irrigation equipment, and so forth, whenever flow monitoring and control are important.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A MEMS based pressure sensing system for flow rate measurements, comprising:
   a sensor partitioned into a first half and a second half, with a wall member separating said first half and said second half;
   a pressure block comprising a sensing diaphragm associated with a piezoresistive material, wherein said sensing diaphragm deflects when a pressure is applied to said piezoresistive material;
   a first signal conditioning unit arranged in said first half of said sensor, wherein said first signal conditioning circuit comprises an impedance circuit embedded with at least one piezoresistive element associated with said piezoresistive material; and
   a second signal conditioning unit arranged in said second half of said sensor, wherein said second signal conditioning unit incorporates a signal amplifier, such that said first and second signal conditioning units, said pressure block, said sensing diaphragm and said sensor provide a MEMS based pressure sensing system for flow rate measurements.

2. The system of claim 1 wherein said signal amplifier comprises an ASIC.

3. The system of claim 1 further comprising:
   a conductive elastomeric pad positioned within said first half;
   a pressure sensor positioned on said conductive elastomeric pad;
   an elastomeric media seal positioned on said sensor;
   a flow through tube located on said elastomeric media seal, wherein said flow through tube is attached to a housing such that a flow through said flow tube and said housing together form a hermetic seal by snap fit, which prevents an escape or an entry of fluid through said hermetic seal, wherein said flow through said flow tube follows a path for admitting a fluid under pressure into said first half.

4. The system of claim 3 further comprising an electrical connector through said wall member thereby forming an electrical connection between said sensor and said signal amplifier.

5. The system of claim 3 further comprising a lead frame comprising a plurality of electrical connectors extending through said housing, wherein said lead frame forms an electrical connection with said sensor and said signal amplifier.

6. The system of claim 1 wherein said sensor comprises a piezoresistive pressure sensor.

7. The system of claim 1 wherein said impedance circuit comprises a four-resistor Wheatstone bridge fabricated on a single monolithic die utilizing micromachining technology.

8. The system of claim 1 wherein said first signal conditioning unit on excitation produces a signal output.

9. The system of claim 2 wherein said ASIC comprises:
   a programmable gain amplifier (PGA) for pre-amplifying a bridge sensor signal generated by a bridge sensor;
   a multiplexer (MUX) connected to said PGA, wherein said MUX transmits said bridge sensor signal from said bridge sensor;
   an analog-to-digital converter (ADC) connected to said MUX, wherein said ADC converts said bridge sensor signal from said MUX into at least one digital value;
   a calibration microcontroller (CMC) connected to said ADC, wherein said CMC provides a digital signal correction to said at least one digital value generated by said ADC;
   a ROM connected to said CMC, wherein said ROM stores a special correction formula;
   an EEPROM connected to said CMC, wherein said EEPROM calibrates correction equation coefficients;
   a digital-to-analog converter (DAC) for converting a final value output from said CMC into an analog voltage; and
   a serial interface (SIF) connected to said EEPROM, wherein said SIF provides an output signal.

10. The system of claim 9 wherein said SIF programs configuration data and correction parameters into said EEPROM.

11. A MEMS based pressure sensing system for flow rate measurements, comprising:
    a sensor partitioned into a first half and a second half, with a wall member separating said first half and said second half, wherein said sensor comprises a piezoresistive pressure sensor;
    a pressure block comprising a sensing diaphragm associated with a piezoresistive material, wherein said sensing diaphragm deflects when a pressure is applied to said piezoresistive material;
    a first signal conditioning unit arranged in said first half of said sensor, wherein said first signal conditioning circuit comprises an impedance circuit embedded with at least one piezoresistive element associated with said piezoresistive material; and
    a second signal conditioning unit arranged in said second half of said sensor, wherein said second signal conditioning unit incorporates a signal amplifier, wherein said signal amplifier comprises an ASIC, such that said first and second signal conditioning units, said pressure block, said sensing diaphragm and said sensor provide a MEMS based pressure sensing system for flow rate measurements.

12. The system of claim 11 further comprising:
    a conductive elastomeric pad positioned within said first half;
    a pressure sensor positioned on said conductive elastomeric pad;
    an elastomeric media seal positioned on said sensor;
    a flow through tube located on said elastomeric media seal, wherein said flow through tube is attached to a housing such that a flow through said flow tube and said housing together form a hermetic seal by snap fit, which prevents an escape or an entry of fluid through said hermetic seal, wherein said flow through said flow tube follows a path for admitting a fluid under pressure into said first half.

13. The system of claim 12 further comprising an electrical connector through said wall member thereby forming an electrical connection between said sensor and said signal amplifier.

14. The system of claim 12 further comprising a lead frame comprising a plurality of electrical connectors extending through said housing, wherein said lead frame forms an electrical connection with said sensor and said signal amplifier.

15. The system of claim 11 wherein said impedance circuit comprises a four-resistor Wheatstone bridge fabricated on a single monolithic die utilizing micromachining technology.

16. The system of claim 11 wherein said first signal conditioning unit on excitation produces a signal output.

17. The system of claim 11 wherein said ASIC comprises:
a programmable gain amplifier (PGA) for pre-amplifying a bridge sensor signal generated by a bridge sensor;
a multiplexer (MUX) connected to said PGA, wherein said MUX transmits said bridge sensor signal from said bridge sensor;
an analog-to-digital converter (ADC) connected to said MUX, wherein said ADC converts said bridge sensor signal from said MUX into at least one digital value;
a calibration microcontroller (CMC) connected to said ADC, wherein said CMC provides a digital signal correction to said at least one digital value generated by said ADC;
a ROM connected to said CMC, wherein said ROM stores a special correction formula;
an EEPROM connected to said CMC, wherein said EEPROM calibrates correction equation coefficients;
a digital-to-analog converter (DAC) for converting a final value output from said CMC into an analog voltage; and
a serial interface (SIF) connected to said EEPROM, wherein said SIF provides an output signal.

18. The system of claim 17 wherein said SIF programs configuration data and correction parameters into said EEPROM.

19. A MEMS based pressure sensing system for flow rate measurements, comprising:
a sensor partitioned into a first half and a second half, with a wall member separating said first half and said second half;
a pressure block comprising a sensing diaphragm associated with a piezoresistive material, wherein said sensing diaphragm deflects when a pressure is applied to said piezoresistive material;
a first signal conditioning unit arranged in said first half of said sensor, wherein said first signal conditioning circuit comprises an impedance circuit embedded with at least one piezoresistive element associated with said piezoresistive material, wherein said impedance circuit comprises a four-resistor Wheatstone bridge fabricated on a single monolithic die utilizing micromachining technology, such that said first signal conditioning unit on excitation produces a signal output; and
a second signal conditioning unit arranged in said second half of said sensor, wherein said second signal conditioning unit incorporates a signal amplifier, such that said first and second signal conditioning units, said pressure block, said sensing diaphragm and said sensor provide a MEMS based pressure sensing system for flow rate measurements.

20. The system of claim 19 further comprising:
a conductive elastomeric pad positioned within said first half;
a pressure sensor positioned on said conductive elastomeric pad;
an elastomeric media seal positioned on said sensor;
a flow through tube located on said elastomeric media seal, wherein said flow through tube is attached to a housing such that a flow through said flow tube and said housing together form a hermetic seal by snap fit, which prevents an escape or an entry of fluid through said hermetic seal, wherein said flow through said flow tube follows a path for admitting a fluid under pressure into said first half;
an electrical connector through said wall member thereby forming an electrical connection between said sensor and said signal amplifier; and
a lead frame comprising a plurality of electrical connectors extending through said housing, wherein said lead frame forms an electrical connection with said sensor and said signal amplifier.

* * * * *